United States Patent [19]

Ohta et al.

[11] Patent Number: 4,764,441

[45] Date of Patent: Aug. 16, 1988

[54] PHOTO-MASK FOR PRODUCTION OF SUBSTRATE FOR OPTICAL MEMORY ELEMENT

[75] Inventors: Kenji Ohta; Junji Hirokane; Tetsuya Inui; Akira Takahashi; Hiroyuki Katayama, all of Nara, Japan

[73] Assignee: Sharp Kabushiki Kaisha, Japan

[21] Appl. No.: 930,157

[22] Filed: Nov. 12, 1986

[30] Foreign Application Priority Data

Nov. 22, 1985 [JP] Japan ................................ 60-263316
Nov. 22, 1985 [JP] Japan ................................ 60-263317

[51] Int. Cl.$^4$ .............................................. G03F 9/00
[52] U.S. Cl. ..................................... 430/5; 156/659.1; 430/313

[58] Field of Search ...................... 430/5, 14, 296, 945, 430/313; 427/43.1, 53.1, 54.1, 294; 156/656, 659.1, 667; 428/209, 210, 418, 432; 204/192.12, 192.15, 192.23

[56] References Cited

U.S. PATENT DOCUMENTS 4,440,841 4/1984 Tabuchi ........................ 156/656 X
4,544,443 10/1985 Ohta et al. ........................ 156/643
4,670,365 6/1987 Yoshihara ........................ 430/5

Primary Examiner—William A. Powell
Attorney, Agent, or Firm—Flehr, Hohbach, Test, Albritton & Herbert

[57] ABSTRACT

A photo-mask which is used for the production of a substrate for an optical memory element includes a reflective film formed over an ultraviolet non-transmissive film on a substrate. Alternatively, a multi-layer dielectric film which is not transmissive to light of wavelength about 400 nm but transmissive to light of wavelength about 450 nm is formed on a substrate.

13 Claims, 4 Drawing Sheets

FIG.—1
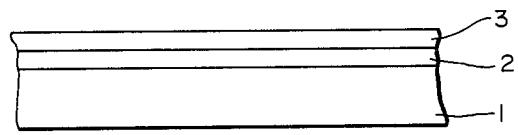
FIG.—5A
(PRIOR ART)
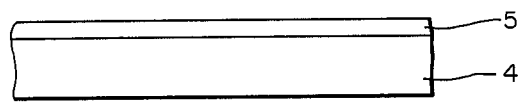
FIG.—5B
(PRIOR ART)
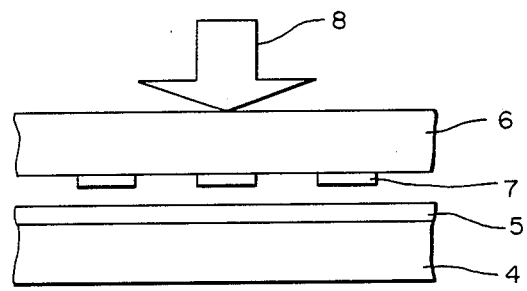
FIG.—5C
(PRIOR ART)
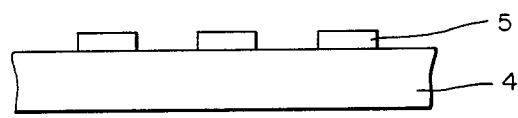
FIG.—5D
(PRIOR ART)
FIG.—5E
(PRIOR ART)
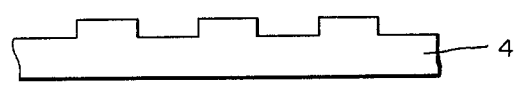

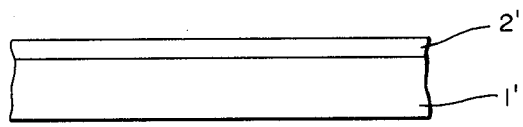
FIG.—2
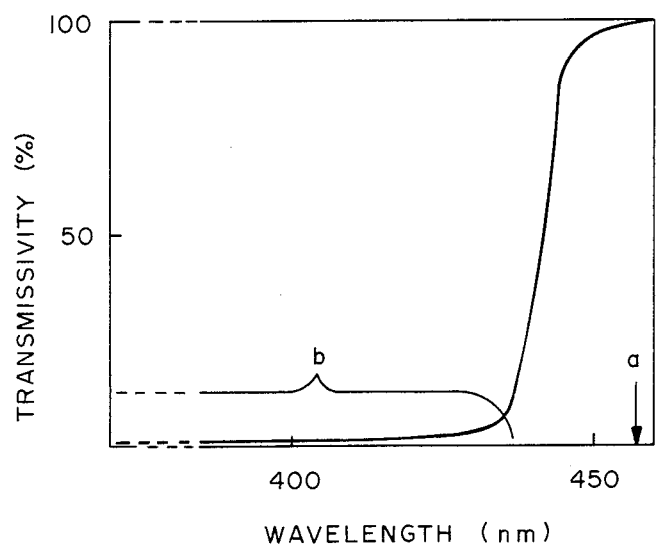
FIG.—3

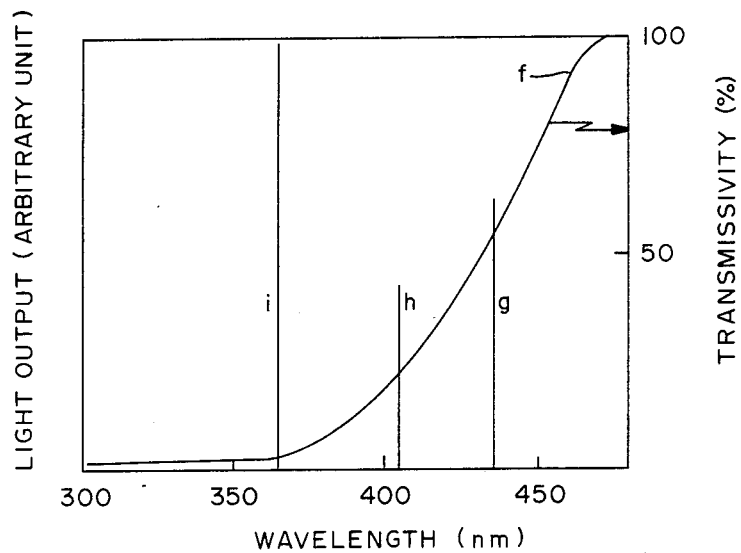
FIG.—4
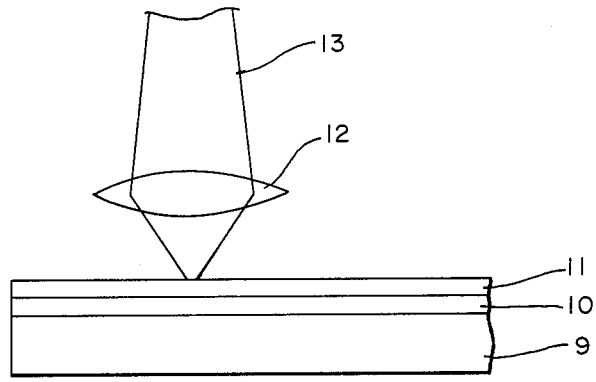
FIG.—6
(PRIOR ART)

FIG.—7A
(PRIOR ART)
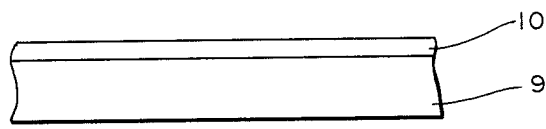
FIG.—7B
(PRIOR ART)
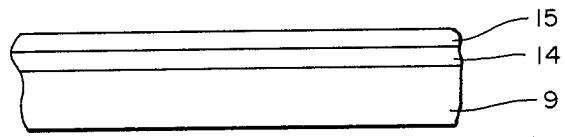
FIG.—7C
(PRIOR ART)
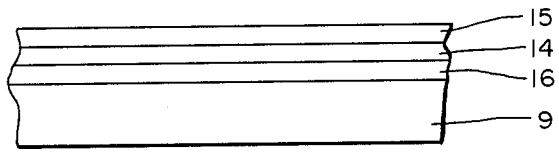
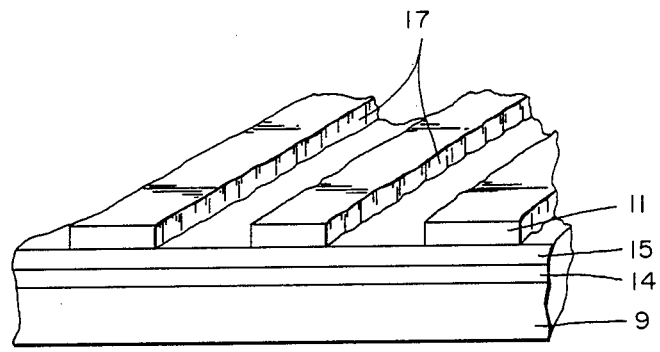
FIG.—8
(PRIOR ART)

PHOTO-MASK FOR PRODUCTION OF SUBSTRATE FOR OPTICAL MEMORY ELEMENT

BACKGROUND OF THE INVENTION

This invention relates to a photo-mask and in particular to a photo-mask to be used for the production of a substrate for an optical memory element.

Recently, the importance of optical memory elements as large-capacity high-density memory devices has been increasing. Depending on the manner in which they are used, optical memory elements can be divided into the following three categories: the read-only type, the add-on type and the erasable type. Of these, optical memory elements used as add-on or erasable memories are generally provided with guide tracks for guiding a light beam to a desired position thereon for recording, reading or erasing information as well as addresses for identifying the individual tracks. If tracks are further divided into sectors for managing the stored information, sector numbers may also be provided on the tracks.

One of the methods of producing such guide tracks (grooves) has been described, for example, in U.S. Pat. No. 4,544,443 issued Oct. 1, 1985 and assigned to the present assignee. Accordng to this method, a resist film 5 is applied to a glass substrate 4 as shown in FIG. 5(a) by using a spinner or the like and then it is exposed to a beam 8, for example, of ultraviolet light through a photo-mask 6. Guide tracks, guide numbers and sector numbers are preliminarily patterned on the photo-mask 6 such that they are transferred to the resist film 5. With reference to FIG. 5(b), parts indicated by the numeral 7 are partially removed light non-transmissive film of Cr, Ta or the like, forming a desired pattern to be transferred. After the resist film is developed as shown in FIG. 5(c), the pattern is directly etched on the glass substrate 4 as shown in FIG. 5(d) by a reactive ion etching method wherein an etching gas such as $CF_4$ and $CHF_3$ or by a wet etching method, for example, with a HF solution. Finally, the residual resist film is removed as shown in FIG. 5(e) by ashing in a $O_2$ plasma or washing with a solvent such as acetone.

The photo-mask 6 used in the step corresponding to FIG. 5(b) can be manufactured, as shown in FIG. 6, by forming a resist film 11 on a light non-transmissive film 10 over a circular disk-shaped photo-mask substrate 9 and using a beam 13, for example, from an Ar laser with a converging objective lens 12 to produce a spiral or circular guide track on the resist film 11 while rotating the disc around its central axis.

FIG. 7 shows examples of cross-sectional structures of various photo-masks which have been used in semiconductor industries. FIG. 7(a) is an example wherein a single-layer film of Cr 10 is formed on a mask substrate 9. FIG. 7(b) is another example which shows a double-layer structure with Cr 14 and $CrO_x$ 15, the latter 15 being used as an antireflective layer. If reflectivity is too high when a master mask is manufactured with a photo-repeater, the image resolution of the manufactured pattern may sometimes become worse. When a pattern is transferred to a resist film on a silicon wafer, the pattern resolution may also become worse by the multiple reflections between Cr and the wafer. The antireflective film is intended to prevent such results in these applications. FIG. 7(c) is still another example wherein an $InO_3$ film 16 is inserted between the Cr film 14 and the glass substrate 9.

If the method shown in FIG. 6 is used to form guide tracks or to record track numbers and sector addresses on a mask of the kind shown in FIG. 7, the Ar laser light used for this purpose becomes absorbed by the Cr film. This is particularly the case when an antireflective film is present as shown in FIG. 7(b). This causes an increase in the temperature of the resist film and the resist film becomes destroyed by heat. Edge surfaces of the recorded resist will become uneven as shown at 17 in FIG. 8. If a mask with resist film having such rough edge surfaces is used for the manufacture of optical memory elements as shown in FIG. 5, large noise will be generated in the signals recorded in the element because of the scattering of light by such uneven surfaces.

SUMMARY OF THE INVENTION

It is therefore an object of the present invention to provide a photo-mask for an optical disc memory which can be manufactured by preventing the temperature of its resist film from rising such that the edge surfaces of the guide tracks formed on the mask are smoothly flat.

The above and other objects of the present invention are achieved by providing on a substrate a photo-mask with a film which is not transmissive to ultraviolet beams and a reflective film on this ultraviolet non-transmissive film, or alternatively a multi-layer dielectric film which does not pass beams with wavelengths in the neighborhood of 400 nm but passes beams with wavelengths in the neighborhood of 450 nm.

BRIEF DESCRIPTION OF THE DRAWINGS

The accompanying drawings, which are incorporated in and form a part of the specification, illustrate embodiments of the present invention and, together with the description, serve to explain the principles of the invention. In the drawings:

FIG. 1 is a cross-sectional view of a portion of photo-mask embodying the present invention, FIG. 2 is a cross-sectional view of a portion of photo-mask according to another embodiment of the present invention, FIG. 3 is an ideal spectroscopic characteristic of transmissivity of a mask of the present invention, FIG. 4 is a spectroscopic characteristic of a mask according to another embodiment of the present invention and light emission characteristics of the light source used when a mask pattern is transferred to an optical memory element, FIGS. 5A–5E show conventional production processes of an optical memory element, FIG. 6 is a schematic drawing showing a conventional process of recording a pattern on a mask, FIGS. 7(a), (b) and (c) are cross-sectional views showing the structures of prior art masks, and FIG. 8 is a schematic drawing of a perspective view showing guide tracks produced by a conventional method.

DETAILED DESCRIPTION OF THE INVENTION

FIG. 1 is a cross-sectional view of a portion of photo-mask embodying the present invention. On a mask substrate 1 is formed a film 2 which does not transmit ultraviolet light (ultraviolet non-transmissive film), and further on top of this ultraviolet non-transmissive film 2 is formed a reflective film 3.

The mask substrate 1 may be glass, an acryl resin, an epoxy resin, etc. The ultraviolet non-transmissive film 2 may be a Cr or Ta film formed by a sputtering or vacuum vapor deposition method.

This embodiment of the present invention is characterized as having a reflective film 3 on the ultraviolet non-transmissive film 2. The reflective film 3 is usually a single-layer or multi-layer dielectric film and may also be formed by a vacuum vapor deposition or sputtering method.

If the method of recording guide tracks shown in FIG. 6 is used on a mask of the aforementioned type including a reflection-increasing film instead of a conventional antireflective film, say, of $CrO_x$, the Ar laser beam is not absorbed by the Cr film and hence the temperature of the Cr film does not rise to destroy the resist film. An antireflective film is generally formed on the Cr film, as explained above, for preventing the worsening of resolution of the manufactured pattern for the situation where the master mask is manufactured by a photo-repeater. According to the present invention, by contrast, reflectivity is intentionally increased for the production of a mask.

With a single Cr film, reflectivity is about 50%. Use of a photo-mask with a single Cr film is conceivable but as much as 50% of light is converted into heat energy and the effect of the present invention cannot be sufficiently enjoyed.

Since the basic concept of the present invention is to increase the reflectivity of the photo-mask surface, the type of or the number of layers in the reflection-enhancing film does not limit the scope of the present invention. According to another embodiment of the present invention illustrated in FIG. 2, therefore, there is formed on a mask substrate 1' a multi-layer dielectric film 2' which is characterized as being not transmissive to light of wavelengths in the neighborhood of 400 nm but transmissive to light of wavelengths in the neighborhood of 450 nm.

The mask substrate 1' may again be glass, acryl resin or apoxy resin. Dielectric compounds such as $SiO_2$, $CeO$, $TiO_2$, $Al_2O_3$ and $MgF$ are used for the multi-layer dielectric film 2' which is formed by a sputtering or vacuum vapor deposition method, and preferably has a transmission characteristic illustrated in FIG. 3. The multi-layer dielectric film 2' of this invention is transmissive, for example, to the Ar laser beam (of wavelength 457.9 nm) used for the manufacturing of a mask but not to the ultraviolet light used for the transfer of a pattern (for example, as shown in FIG. 5(b)). When such an Ar laser beam is made incident for recording a pattern on the mask, it penetrates the mask entirely except for the small amount of energy absorbed by the resist film. Thus, unlike the conventional situations where a Cr mask is used and laser energy is absorbed by the Cr film, a rise in temperature of the resist film does not result according to the present invention. When this mask is used to transfer a pattern onto a substrate of an optical memory element, it can fully serve its purpose because it is sufficiently reflective with respect to the beam used for this transfer. For this purpose, the mask need not reflect all light. It is required only to prevent ultraviolet beams from passing through.

The wavelength-dependence of transmissivity depicted in FIG. 3, showing merely an ideal example, does not limit the present invention because it is not stringently required that the Ar laser beam be transmitted by 100% and ultraviolet beams be reflected by 100%. If the transmissivity characteristics are as shown in FIG. 4, a filter which is not transmissive to the g and h lines but does transmit the i line might be installed in the ultraviolet beam 13 of FIG. 6. If a majority of the beam incident on the mask is the i line, the spectroscopic characteristics of the dielectric film may be such as to pass a small portion of the incoming ultraviolet beams as shown by the f line in FIG. 4.

The foregoing description of preferred embodiments of the invention has been presented for purposes of illustration and description. It is not intended to be exhaustive or to limit the invention to the precise form disclosed, and many modifications and variations are possible in light of the above teaching. For example, although the present invention has been described above by way of a mask for an optical disc memory, the present invention is not limited to discs. A mask embodying the present invention can be very useful when a mask pattern is produced by converging a beam of an Ar laser, a HeCd laser and the like. In summary, patterns like guide tracks with smoothly flat side edges can be obtained while preventing a rise in the temperature of the resist such that an increase in the noise level can be prevented when use is made of an optical memory element produced by using such a mask. Modifications and variations which may be apparent to a person skilled in the art are intended to be included within the scope of this invention.

What is claimed is:

1. A photo-mask comprising
a mask substrate,
an ultraviolet non-transmissive film formed on said mask substrate, and
a reflective film formed on said ultraviolet non-transmissive film.

2. The photo-mask of claim 1 wherein said reflective film comprises one or more dielectric film layers.

3. The photo-mask of claim 1 which is used for the production of a substrate for an optical memory element.

4. The photo-mask of claim 1 wherein said ultraviolet non-transmissive film comprises Cr.

5. The photo-mask of claim 1 wherein said ultraviolet non-transmissive film comprises Ta.

6. A photo-mask comprising a mask substrate and a multi-layer dielectric film over said mask substrate, said dielectric film being non-transmissive to light of wavelength about 400 nm and transmissive to light of wavelength about 450 nm.

7. The photo-mask of claim 6 which is used for the production of an optical memory element.

8. The photo-mask of claim 6 wherein said mask substrate is of a material selected from a group consisting of glass, acryl resins and epoxy resins.

9. The photo-mask of claim 6 wherein said multi-layer dielectric film comprises $SiO_2$.

10. The photo-mask of claim 6 wherein said multi-layer dielectric film comprises CeO.

11. The photo-mask of claim 6 wherein said multi-layer dielectric film comprises $TiO_2$.

12. The photo-mask of claim 6 wherein said multi-layer dielectric film comprises $Al_2O_3$.

13. The photo-mask of claim 6 wherein said multi-layer dielectric film comprises MgF.

* * * * *